United States Statutory Invention Registration [19]

Moran

[11] Reg. Number: H995

[43] Published: Nov. 5, 1991

[54] PREAMPLIFIER FOR LASER GUIDED PROJECTILE

[75] Inventor: Robert D. Moran, Dahlgren, Va.

[73] Assignee: The United States of America as represented by the Secretary of the Navy, Washington, D.C.

[21] Appl. No.: 671,711

[22] Filed: Nov. 15, 1984

[51] Int. Cl.[5] ..... H03G 3/10; H03G 3/18; H03G 3/30

[52] U.S. Cl. ..... 330/278; 244/3.16; 250/214 AG; 356/152

[58] Field of Search ..... 356/152; 250/214 AG; 244/3.16; 330/278

[56] References Cited

U.S. PATENT DOCUMENTS

| | | | |
|---|---|---|---|
| 3,954,340 | 5/1976 | Blomqvist et al. | 356/152 |
| 3,970,269 | 7/1976 | Conforti | 244/3.16 |
| 4,006,356 | 2/1977 | Johnson et al. | 250/203 R |
| 4,131,254 | 12/1978 | Underwood | 244/316 |
| 4,234,145 | 11/1980 | Leiboff | 244/316 |
| 4,305,044 | 12/1981 | Leidich | 330/278 |
| 4,361,815 | 11/1982 | Schade, Jr. | 330/278 |
| 4,371,846 | 2/1983 | Gamble | 330/278 |
| 4,376,267 | 3/1983 | Chu et al. | 330/284 |
| 4,439,744 | 3/1984 | Kumar et al. | 330/277 |

*Primary Examiner*—Bernarr E. Gregory
*Attorney, Agent, or Firm*—Kenneth E. Walden; Frederick A. Wein

[57] ABSTRACT

A gain controllable amplifier wherein a plurality of signal paths are provided with each of the signal paths having predetermined different gain characteristics. The gain of the total amplifier is selected by application of power supply voltages to amplying stages of the different signal paths with the combination of the level of the voltages determining which signal path will be operational and the total gain of the amplifier.

4 Claims, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

PREAMPLIFIER FOR LASER GUIDED PROJECTILE

BACKGROUND OF THE INVENTION

The present invention relates to a projectile guidance system for receiving signals of reflected laser energy from a target and generating missile command steering signals, and more particularly, to a low noise preamplifier having wide dynamic range for use in such a laser guided system.

Guiding a missile to a target illuminated by laser energy requires the utilization of the reflected laser energy to generate missile commands. Typically, personnel illuminate a target with laser energy and nearby aircraft, carrying guided missiles, scan the terrain and locate the laser illuminated target by detecting the reflected laser energy. A detector in the missile nose cone is directed at the target and the missile is fired at the target when the target is within range of the missile. The missile is guided to the target by error signals generated by a laser signal processor.

Generally, the applicable system receives the laser energy reflected by the target and that laser light is focused onto a small spot on a quadrant detector. The quadrant detector provides an output signal from the quadrant or quadrants upon which the spot of laser radiation falls. A processor coupled to the output terminals of each quadrant determines the location of the radiation spot and an error signal is generated. Appropriate missile steering commands are generated in response to the error signals.

Laser guided weapon systems generally utilize multiple laser detectors which typically detect very short pulses of laser energies at a relatively low repetition rate. The intensity of the receive signal and consequently the peak value of each pulse may very widely over the trajectory of the weapon. For example, the signals are weak in the maximum range case and increase with decreasing range. Additionally, movement of the target causes changes in reflectivity, variations in the propagation path, presence of smoke and other obstructions in the optical path, and similarly factors can produce rapid and large variations in signals from the detector. To obtain reliable control signals for operation of the guidance system it is necessary to maintain amplitude proportionality among the received pulses. Therefore it is necessary to prevent overloading, clipping, or other non-linearities in the signal circuits.

The energy reflected by the target and focused on the detector is a series of extremely narrow pulses the amplitude of which can increase by a factor as great as $10^6$ (120 dbv) as the missile moves toward the target. Generally, a quadrant detector and a preamplifier are utilized. The quadrant detector is a silicon photoconductive junction device operated in a reverse bias mode and behaves as a light controlled current source. Assuming proper loading, the detector output is a series of narrow pulses that closely duplicate the input laser pulse shape. A typical detector output pulse is approximately 20 nsec wide at the half current point and the amplitude can vary over a range of $10^6$.

The preamplifier requires a wide bandwidth to be able to pass the narrow pulses and is required to have a low noise figure. A typical dynamic range to be achieved is in the order of 120 dbv. The purpose of the preamplifier is to amplify the detector output with as much fidelity as possible to a level large enough to conveniently process the signal. It is highly desirable that the preamplifier be mounted as close to the detector as possible to reduce the effects of stray capacitances and noise pickup. The preamplifier is a transimpedance device in that it converts the detector output current into a voltage. This allows the detector to be loaded by a low impedance without the addition of Johnson noise. The gain of the preamplifier must be high and for good pulse resolution a bandwidth is necessary up to 20 MHz. Such a bandwidth provides near unity pulse response with minimal pulse stretching with a wider bandwidth reducing the system sensitivity by allowing more noise. Damping must be such that little or no over-shoot occurs. Noise must be kept low of the order of 25 namp rms. Input impedance should be less than 400 ohms to obtain adequate response from the detector since the detector rise time is a function of the load resistance, detector capacitance, and any stray capacitance as well as preamplifier bandwidth. The preamplifier must be a.c. coupled to the detector in order to prevent saturation which could occur if a strong background signal such as the sun is in the field of view. A load resistor is required to provide a d.c. path for the detector bias voltage.

The preamplifier should have a large instantaneous dynamic range as well as a total dynamic range of greater than 120 dbv. The instantaneous dynamic range is needed to acquire targets with a strong input at short ranges. The requirement for such a large dynamic range conflicts with the need for high gain. However, this conflict can be resolve by reducing the gain as a function of incoming signal. The gain may be reduce either by switching to a lower gain at a predetermined signal level or by an automatic gain control (AGC) system where gain is reduce as a continuous function of signal level. However, the gain switching approach has a major advantage of being able to achieve extremely low electronic boresight error. A separate preamplifier is used for each detector quadrant so that the gain of each must be close match to the others over the dynamic range. At each gain level, the preamplifier is a linear amplifier and the gain can be adjusted so that all quadrants match over the entire dynamic range.

One of the major disadvantages of the continuous AGC preamplifier is that when the AGC loop is closed in the system, the preamplifier has a nonlinear response and matching the gain of four nonlinear amplifiers over 120 dbv range is required. Channel balance is difficult to achieve in the last 30 dbv of dynamic range when the missile is close to the target and boresight error has the most effect on accuracy of trajectory.

Accordingly, it is desirable to provide a gain controlled preamplifier having the requisite wide dynamic range, low noise characteristics, wide bandwidth, and substantial linearity with controllable gain conditions for maintaining the most accurate target positional sensing.

SUMMARY OF THE INVENTION

Briefly, the present invention is for a gain controllable amplifier wherein a plurality of signal paths are provided with each of the signal paths having predetermined different gain characteristics. The gain of the total amplifier is selected by application of power supply voltages to amplifying stages of the different signal paths with the combination of the level of the voltages determining which signal path will be operational and the total gain of the amplifier.

Accordingly, it is an object of the present invention to provide a simple, reliable and accurate guidance system for guiding a missile to target.

Another object of the present invention is to provide a wide bandwidth, low noise, high linearity preamplifier which is gain controllable by power supply voltage to have a dynamic range in the order of 120 dbv.

Another object of the present invention is to provide a gain controlled low noise preamplifier in which the gain can be controlled for a range of signals without degradation of the preamplifier noise characteristic or introduction of nonlinearities.

Further objects and advantages of the present invention will become apparent as the following description proceeds and the features of novelty characteristizing the invention will be pointed out the particularity in the claims annexed to and forming a part of this specification.

DESCRIPTION OF THE DRAWINGS

For a better understanding of the present invention reference will be made to the accompanying drawings wherein the same reference numerals have been applied to like parts and wherein.

DETAILED DESCRIPTION OF THE PREFERRED EMBODIMENT

Figure 1:
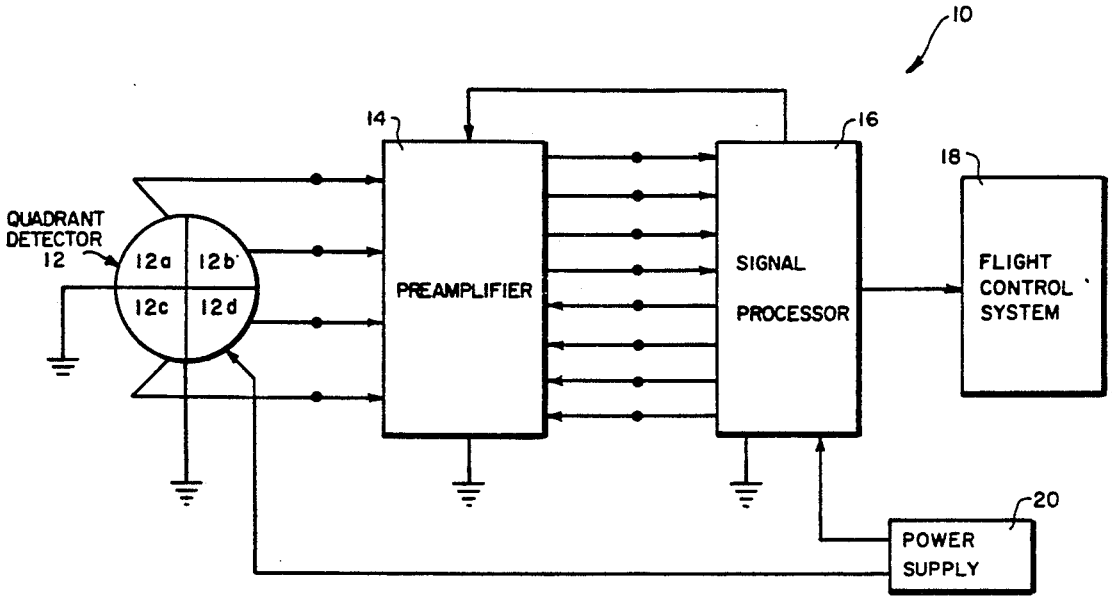
FIG. 1 is a simplified block diagram representation of a typical laser guidance system.

Referring now to FIG. 1 of the drawings there is shown a simplified block diagram of a laser guidance system generally designed as 10. Such guidance systems will normally utilize four channels to provide azimuth and elevational control of a missile. Laser quadrant detector 12 produces an output in response to incident laser radiation in each of the quadrants 12*a*, *b*, *c* and *d*. The output of the respective quadrant detector 12 is inputted to a respective preamplifier 14 which is designed to have a very low noise figure and a very wide dynamic range. The output from the respective preamplifier 14 connects to a signal processor 16 (digital or analog) which calculates the required guidance control values which are outputted to the flight control system 18 for determining the target trajectory of the projectile. Power for the electronics is provided by a power supply 20.

The signals from the respective preamplifier 14 will be a sequence of very narrow pulses having a low repetition rate with a circuit noise appearing in the base line between pulses. The amplitude of the pulses in each channel is utilized to determine error in heading of the vehicle in which the guidance system is installed. For example, the processing control circuits 16 compare the amplitude of a pulse in one of the azimuth channels to the amplitude of the pulse in the other azimuth channel to thereby develop the necessary control signals for reducing the vehicle azimuth error to zero. Therefore, it is desirable that the preamplifier circuit 14 be operated within its linear capabilities without limiting or otherwise overloading. The intensity of the laser energy incident on laser detector 12 may vary over a wide range when installed in a missile or the like due to many factors. When the intensity is weak, such as for the maximum range case or the case when an obstruction or the like greatly reduces the laser detector signal, it is necessary that the wide band preamplifier 14 contribute minimum noise to the signal. As the incoming signals increase such as for reduced range, it is important that the preamplifier have an exceptionally wide dynamic range for maintaining linearity.

The respective preamplifier 14 is required to amplify the detector output with as much fidelity as possible. Typically, preamplifier 14 is mounted as closed to the detector 12 as possible to reduce the effects of stray capacitance and noise pickup. For this purpose, mounting the preamplifier directly behind the detector 12 is optimum. The preamplifier 14 is a transimpedance device, i.e., it converts the detector output current to a voltage. This allows connection to a low impedance without the addition of Johnson noise. For maximum sensitivity, the gain of preamplifier 14 must be high, in the order of 10,000 to 20,000, and for food pulse resolution, the bandwidth is desired to be between 15 and 20 mhz. The bandwidth of 20 mhz provides a near unity pulse response with a wider bandwidth reducing the system's sensitivity by allowing more noise. Little or no over-shoot should occur and the noise must be kept low in order of 25 nanoamps rms.

The input impedance of preamplifier 14 should be less than 400 ohms to obtain adequate response from the detector 12 since the observed detector rise time is a function of load impedance, detector capacitance, and any stray capacitance as well as preamplifier bandwidth.

Figure 2:
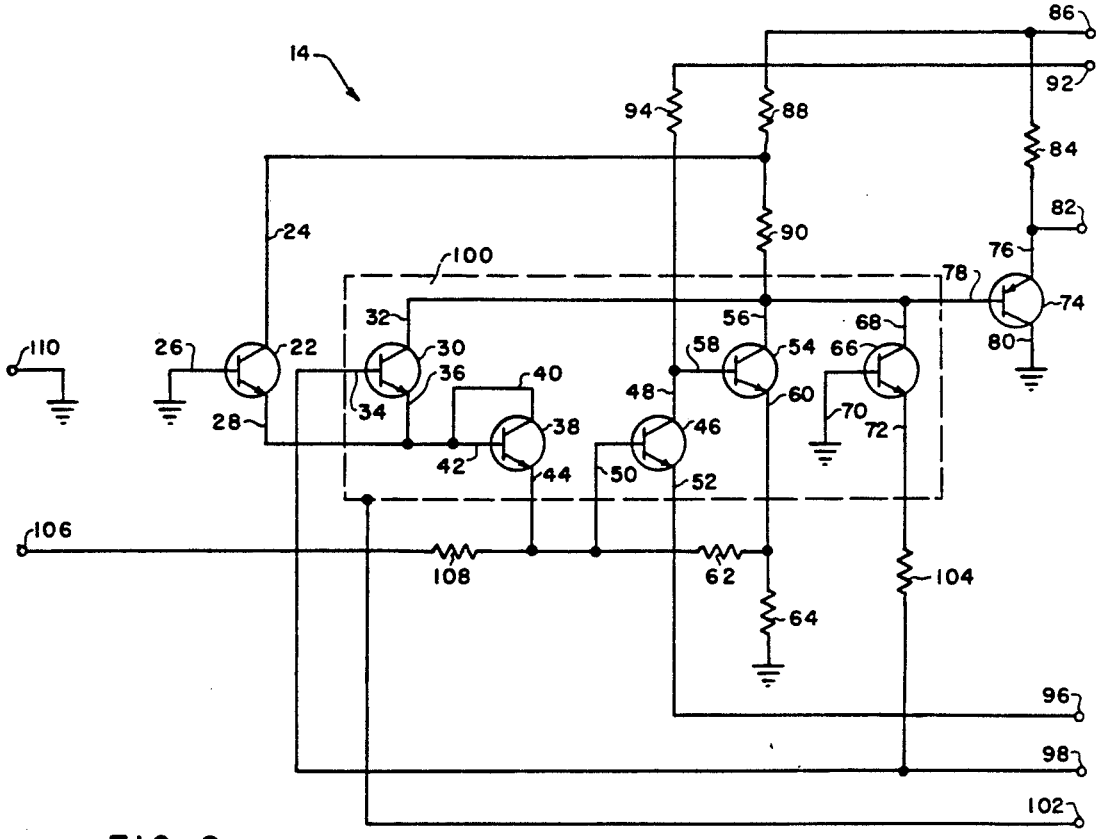
FIG. 2 is a schematic diagram of the preamplifier of FIG. 1 of the exemplary embodiment.

Referring now to FIG. 2 there is shown a schematic representation of one channel of preamplifier 14. Transistor 22 is provided having a collector 24, a base 26, and an emitter 28 with the base 26 being connected to circuit ground. Emitter 28 is connected to transistor 30 having a collector 32, a base 34, and an emitter 36 connected to emitter 28 as well as to collector 40 and base 42 of transistor 38 having an emitter 44. Emitter 44 is connected to a transistor 46 having a collector 48, a base 50, and an emitter 52. Base 50 is connected to emitter 44. Collector 48 is connected to a transistor 54 having a collector 56, a base 58 connected to collector 48, and an emitter 60 connected to base 50 through resistor 62 and connected to ground by resistor 64. Collector 56 is connected to a transistor 66 having a collector 68 connected to collector 56, a base 70 connected to ground, and an emitter 72. Collector 68 is connected to collector 32 and a transistor 74 having an emitter 76, a base 78 connected to collector 68 and a collector 80 connected to ground. Transistor 74 is shown in the exemplary embodiment to be a PNP transistor with the output at an emitter 76 appearing at output terminal 82. Transistor 74 derives its power at emitter 76 through a resistor 84 connected to a power supply terminal 86.

Power supply from 86 is also provided to transistor 54 through series resistors 88 and 90, the junction of resistors 88 and 90 being connected to collector 24. Collector 48 is connected to power supply terminal 92 through resistor 94. Emitter 52 is connected to a power supply terminal 96 and base 34 is connected to a power supply terminal 98. In the exemplary embodiment, portions of the circuit, i.e., transistor 30, 38, 46, 54, and 66 are provided on a monolithic integrated circuit 100 with the substrate of monolithic integrated circuit 100 being provided an appropriate bias at the power supply terminal 102. Emitter 72 is connected to terminal 98 through resistor 104. Signal input from the respective quadrant detector segment 12 is inputted at terminal 106 through resistor 108 to the junction of emitter 44 and base 50. Circuit grounding is provided at terminal 110. The power supply voltages discussed hereinafter are derived from power supply 20 or any other appropriate power supply. In the exemplary embodiment, transistors 22, 30, 38, 46, 54 and 66 are NPN and transistor 74 is PNP. However, it is within the contemplation of the used with the value and polarity of voltages changed accordingly.

As discussed hereinbefore, gain switching is provided by appropriate power supply voltages being applied at appropriate terminals. However, certain voltages are not changed, i.e., a voltage of +10 being supplied at terminal 86, a bias voltage of −0.4 volts being supplied at terminal 96 and a substrate bias voltage of −6 volts applied at terminal 102. In order to control the gain of the amplifier, voltages provided at terminal 92 will be changed between +4.0 volts to −8.0 volts and the voltage at terminal 98 will be switched from +0.6 volts and −4.0 volts as will be discussed hereinafter.

Figure 3:
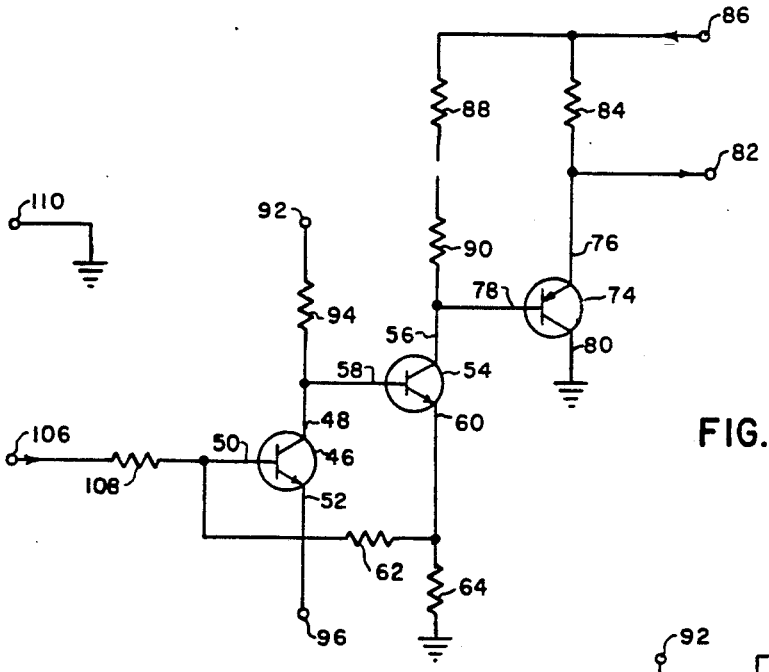
FIG. 3 is a schematic diagram of the high gain mode of the preamplifier of FIG. 2.

The high gain mode is selected by placing +4.0 volts on terminal 92 and +0.6 volts on terminal 98. In this mode, NPN transistors 22, 30, 38, and 66 are reverse biased and effectively are opened circuits. For example, transistor 66 which is a NPN with base 70 connected to ground has +0.6 volts applied to emitter 72 through terminal 98 and thus is cutoff. Additionally, transistor 38 which is connected with collector 40 connected to base 42 is thus wired as a diode having a cathode at emitter 44. Transistor 38 being a silicon transistor requires approximately 0.6 volts for conduction. Thus, the application of 0.6 volts at terminal 98 at the base 34 is insufficient to forward bias transistors 30 ON in a forward bias mode due to voltage across resistor 64 due to connection of transistor 54 thereby raising emitter 44 above ground. Additionally, transistor 22, having its base 26 grounded has emitter 28 raised above ground and is reverse biased. In this mode, the operational schematic of preamplifier 14 is shown in FIG. 3 with the cutoff transistors and their associated circuitry being deleted. The amplifier input is a negative going current pulse and output from transistor 74 is also negative. The gain of the amplifier in this mode is calculated as $R_{62}\ (R_{90}+R_{88})/(R_{64}\ R_{62}/(R_{64}+R_{62}))\times 0.95$ where 0.95 represents the gain of the emitter follower stage and for exemplary embodiment, this gain is approximately 15,000 volts/ampere. For such a mode, the purpose of R108 is two fold. It isolates the amplifier input from the capacitance associated with the detector 12 and also increases the input impedance in low and mid gain modes thus reducing loading on the detector coupling capacitor.

Figure 4:
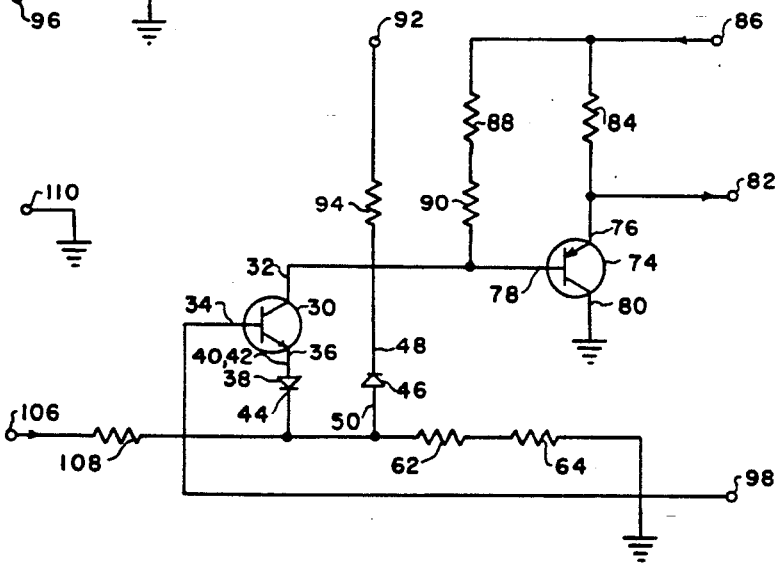
FIG. 4 is a schematic diagram of the medium gain mode of the preamplifier of FIG. 2.

In a similar manner, the schematic for the mid-gain-mode is shown in FIG. 4. The mid-gain is desired to be 30 dbv less than the high gain mode and is accomplished by changing the voltage at terminal 92 from +4 volts to −8 volts with the voltages at the other terminals remaining the same. This change puts a reverse bias on base 58 of transistor 54 which having its emitter at ground through resistor 64 cuts transistor 54 off. Additionally, transistor 46 having its base 50 going to ground through resistors 62 and 64 now has its collector 48 at a substantially negative voltage resulting in the forward biasing of the base-collector junction of transistor 46 which is shown in FIG. 4 as a diode. This brings base 50 of transistor 46 negative which in turn brings emitter 44 of transistor 38 negative and has the effect of bringing emitter 36 of transistor 30 negative thus turning ON transistor 30 since base 34 is connected to +0.6 volts and the collector 32 through resistor 88 and 90 is connected to +10 volts. Since transistor 30 has emitter 36 connected to the input through transistor 38 which connected as a diode, with base 34 connected to a steady power supply voltage, transistor 30 is a common base amplifier amplifying the signal appearing at terminal 106. Formerly amplifying transistors 46 and 54 are now cut-off. The gain of the circuit is provided by transistor 30, transistor 74 being an emitter follower, and gain is approximately $0.95\ (R88+R90)\times(B-1)/B$ where B is the gain of transistor 30. For the exemplary embodiment, this gain is approximately 480 volts per ampere.

Figure 5:
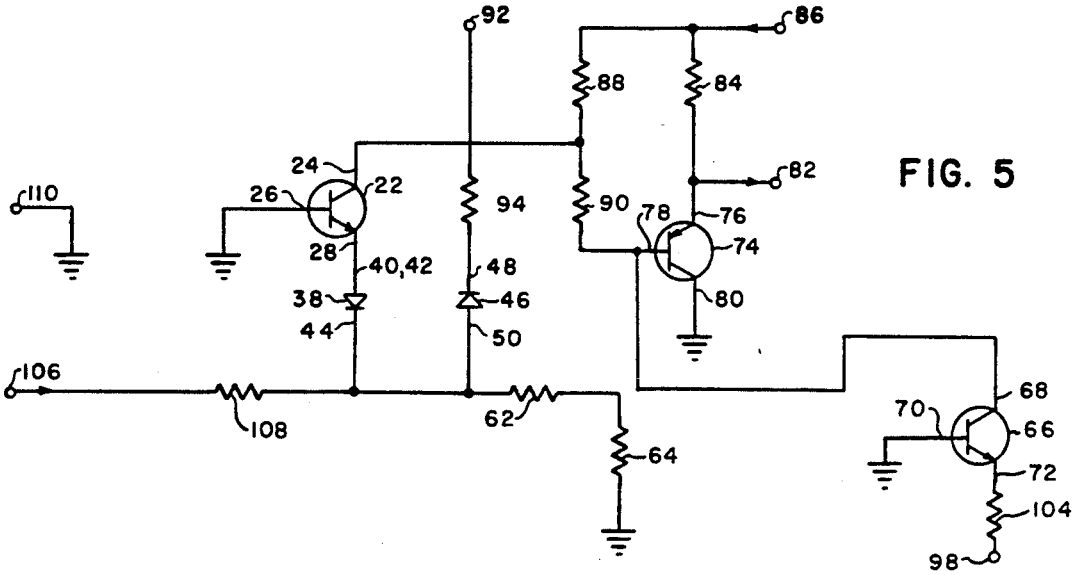
FIG. 5 is a schematic diagram of the low gain mode of the preamplifier of FIG. 2.

When low-gain is desired, e.g., 30 dbv less than mid-gain, this is obtained by changing the voltage at terminal 98 from +0.6 volts to −4.0 volts, keeping other voltages the same. Application of −4 volts to terminal 98 reverse biases transistor 30 thus turning-off transistor 30 and making it an open circuit. This allows transistor 22 to be biased ON with the emitter 28 receiving a negative voltage from the −8 volts applied to terminal 92 through transistors 46 and 38 which are forward biased and wired respectively in a conductive diode mode as shown in FIG. 5. This allows transistor 22 to be a common based amplifier. In this mode the gain is approximately equal to $(B-1)/B\times R_{88}\times 0.95$ where B is the gain of transistor 22. Transistor 66 is biased on from the 8.0 volts from terminal 92 and provides bias current for transistor 74. In the exemplary embodiment this gain is approximately 16 volts per ampere.

Thus, in the high gain mode the amplifying transistors are 46, 54, for the medium gain mode the amplifying transistor is 30, and for the low gain mode the amplifying transistor is 22. Thus, the signal path is different for each gain mode as determined by power supply voltages supplied. Additionally, the gain in each mode is primarily determined by the values of the resistors rather than transistor parameters such that gain matching of the order of within one percent could be obtained by using resistor values matched to within 0.1 percent.

Thus it is shown that the gain of the amplifier is controllable and changable by application of power supply voltages for changing the transistors in a particular circuit path. The amplifying path is modified by the power supply voltages switching ON the active elements in the amplifying path and switching OFF or removing circuit elements connected to the path but not contributing to the gain of the particular mode.

For the amplifier disclosed, the predominate noise source is shot noise generated by the bais current of transistor 46 and assuming a d.c. gain of transistor 46 to be 90 with a collector current of 1.7 ma, the shot noise is 2.7 pA/√Hz. The Johnson noise generated by leakage current through transistor 38, assuming 0.5 μA leakage, is 0.43 pA/√Hz. The thermal (Johnson) noise current of R62 is 1.8 pA/√Hz and the remaining noise sources are so small as to be negliable so that the total noise equivalent input current of the preamplifier is 3.3 pA/√Hz.

Thus there is disclosed a preamplifier having controllable gain wherein the gain of the amplifier is controlled by application of changable power supply values to amplifying members in the amplifier. The power supply values switch from a gain ON condition to a gain OFF condition the selected amplifying members for controlling the gain of the total amplifier. In this manner, signal paths of preselected gains are switched into or out of the system and the gain of the amplifier is controlled while maintaining a low noise level and a dynamic range but maintaining the linearity of the amplifier.

While there has been illustrated and described what is at present considered to be a preferred embodiment of the present invention, it will be appreciated that numerous changes and modifications are likely to occur to those skilled in the art and it is intended in the appended claims to cover all those changes and modifications which fall within the true spirit and scope of the present invention.

What is claimed as new and desired to be secured by Letters Patent is:

1. An amplifier having controllable gain comprising:

a plurality of means for amplifying an externally providable signal, and power supply means for establishing gain operation conditions of each of the plurality of amplifying means, the amplifier being determined by the gain of the of the plurality of amplifying means, the gain of the respective amplifying means being controllable between a gain ON condition and a gain OFF condition by selection of supply power values providable to the respective amplifying means for controlling the gain of the amplifier.

2. A laser detection apparatus comprising:

a quadrant detector for detecting the presence of incident laser light onto the quadrants of the detector, each quadrant of the detector having an electrical output signal in response to incident laser light, and an amplifier means for amplifying the electrical output of each quadrant detector in response to the incident light, the amplifier means having controllable gain, the amplifier means comprising a plurality stages, the gain of the amplifying stages being individually controllable between an ON condition and an OFF condition by selection of power supply values applied to the respective amplifying stages for controlling the gain of the amplifier.

3. The apparatus of claim 2 wherein the plurality of amplifying stages provide alternate signal paths of differing gain, and the gain of the amplifier is controllable by selection of the alternate signal paths.

4. An amplifier having controllable gain comprising:

a plurality of means for amplifying an externally providable signal, said plurality of means comprising a plurality of signal paths of differing gain, and means for switching ON and OFF said individual plurality of signal paths by selection of power supply values, the respective signal path selected determining the gain of the amplifier.

* * * * *